United States Patent [19]

Suzuki

[11] Patent Number: 5,701,093

[45] Date of Patent: Dec. 23, 1997

[54] ADIABATIC MOS LOGIC AND POWER SUPPLYING METHOD AND APPARATUS

[75] Inventor: Seigo Suzuki, Tokyo, Japan

[73] Assignee: Kabushiki Kaisha Toshiba, Kawasaki, Japan

[21] Appl. No.: 616,811

[22] Filed: Mar. 15, 1996

[30] Foreign Application Priority Data

Mar. 15, 1995 [JP] Japan .................. P07-055913
Mar. 14, 1996 [JP] Japan .................. P08-057913

[51] Int. Cl.$^6$ .................................................. H03K 17/16
[52] U.S. Cl. ...................... 326/98; 326/93; 326/21
[58] Field of Search .......................... 326/21, 93, 97–98

[56] References Cited

U.S. PATENT DOCUMENTS

| | | | |
|---|---|---|---|
| 5,457,405 | 10/1995 | Ooms et al. | 326/98 X |
| 5,459,414 | 10/1995 | Dickinson | 326/98 X |
| 5,508,639 | 4/1996 | Fattaruso | 326/98 X |

OTHER PUBLICATIONS

Mead and Conway, Introduction to VLSI Design, Addison-Wesley Pub. Co., Reading, Mass., pp. 338–341, Oct. 1980.
Seitz et al, "Hot–Clock nMOS", 1985 Chapel Hill Conference on VLSI, pp. 1–17, 1985.

Younis et al., "Practical Implementation of Charge Recovering Asymptotically Zero Power CMOS", MIT, Cambridge, Mass., pp. 1–15, Oct. 1992.

Hinman et al., "Power Dissipation Measurements on Recovered Energy Logic", IEEE Symposium on VLSI Circuits Digest of Technical Papers, pp. 19–20, 1994.

Kramer et al., "Adiabatic Computing with the 2N–2N2D Logic Family", IEEE Symposium on VLSI Circuits Digest of Technical Papers, pp. 25–26, 1994.

Primary Examiner—David R. Hudspeth
Attorney, Agent, or Firm—Foley and Lardner

[57] ABSTRACT

A plurality of stages of MOS gate circuits are connected in series and are driven with a 2-phase AC power source. The alternating speed of the power source is slower than the operation speed of internal circuit elements of the MOS gate circuits. A cutoff device such as a transistor is arranged on each side of each of the MOS gate circuits and is connected to the power source. The cutoff devices of each MOS gate circuit are conductive only when one phase of the power source is at high potential and the other at low potential. When the MOS gate circuit of a given stage ($N_i$) is inactive, the MOS gate circuit of the next stage ($N_{i+1}$) holds charge, to reduce an energy loss.

22 Claims, 9 Drawing Sheets

ADIABATIC MOS LOGIC AND POWER SUPPLYING METHOD AND APPARATUS

BACKGROUND OF THE INVENTION

1. Field of the Invention

The present invention relates to a MOS gate circuit, and particularly, to a CMOS gate circuit of low power consumption.

2. Description of the Prior Art

A CMOS gate circuit is a switching element that passes no direct current, the and therefore, dissipates no power theoretically. In practice, the standard CMOS gate circuit has internal resistance (on-resistance) when it is conductive, and the internal resistance dissipates power to produce Joule heat. More precisely, load acting on each CMOS element of the conventional CMOS gate circuit is the wiring to the next gate or to a given circuit, and the operation of each CMOS element is a capacitive charging/discharging operation that involves only a transfer of charge. Accordingly, the operation of each CMOS element consumes no energy or power. Each CMOS element, however, has internal resistance that consumes power whenever a charging/discharging current passes through the element.

Charge accumulated by the CMOS elements is discharged. A power source of an LSI that incorporates the CMOS elements has no means to absorb the discharge. Accordingly, the discharge energy is simply abandoned. This is because the power source is usually a DC power source such as a battery whose voltage is constant and which incorporates no means to absorb energy returned from a load. Accordingly, the energy returned from the conventional CMOS elements is discarded. An electromotive process of the battery is an irreversible chemical process, and therefore, there is no way to recover energy.

An example of a low-power circuit is a clock circuit used as a power source of a ratio-less 4-phase clock circuit. This circuit is used for a low-speed pocket calculator and involves a complicated relationship among the phases of clock signals. The waveform of each clock signal supplied to the circuit must have no ramp. Namely, each clock signal must be a complete rectangular waveform. Due to such constraints on the clock signals to be overlapped, the circuit hardly achieves a high-frequency operation.

As explained above, each element of the conventional CMOS gate circuit has internal resistance that consumes power to produce Joule heat. Charge accumulated by the element is simply abandoned and no power is saved.

The clock circuit serving as a power source of the ratio-less 4-phase clock circuit may supply a complete rectangular wave when the circuit operates at a very low speed, i.e., low frequency. It is difficult, however, to supply a complete rectangular waveform at a high frequency of several tens of megahertzs or over. To supply a complete rectangular waveform, it is necessary to produce a higher harmonic whose frequency is about 100 times as large as that of a fundamental harmonic. Namely, to pass a rectangular waveform of 100 MHz, a frequency band of 10 GHz is necessary. It is impractical to manufacture a resonance circuit having such a wide band, and even if it is made, no energy absorption effect is expected. In the 4-phase clock circuit, four clocks form a stage, which corresponds to 25 MHz (100/4=25) when providing a 100-MHz clock signal. In this case, the latency of a logic operation is very long, i.e., 4 μs per gate.

In a conventional dynamic circuit employing a 4-phase clock signal, a gate (including a composite AND/OR gate) requires a clock. Namely, a gate delay is equal to one clock.

A 4-phase clock operation needs a precharge operation, which dissipates large power. The precharge operation is not necessary for an actual logic operation. The precharge operation is forcibly carried out for each clock and for each gate due to circuitry reasons even if there is no input/output change. The probability of an actual input/output change or transition is about 1/10. This means that charging and discharging operations are repeated 10 times more than necessary, dissipating energy unnecessarily.

SUMMARY OF THE INVENTION

An object of the present invention is to provide a MOS gate circuit of low power dissipation.

In order to accomplish the object, the present invention employs a power source that provides an alternating voltage or a sinusoidal waveform whose inclination at a rise is sufficiently small. The present invention uses the inclination of the source voltage, to reduce an energy loss caused by the internal resistance of a MOS element.

A first aspect of the present invention drives a MOS gate circuit with an alternating source voltage or a sinusoidal wave source voltage instead of a constant source voltage. The alternating speed of the source voltage is slower than the operation speed of internal elements of the MOS gate circuit. Preferably, the source voltage is made of a plurality of alternating or sine-wave voltages having different phases, to reduce a voltage applied to the elements.

FIG. 1 explains the principle of the first aspect of the present invention. A transistor has on-resistance, i.e., internal resistance R when it is conductive. Resistance "r" represents the sum of wiring resistance from a power source $V_{CC}$ or $V_{DD}$ to the transistor and the internal resistance of the power source. When a switch SW is connected to a terminal $T_2$, a voltage at the ends of the resistance R is ΔV. At this time, the resistance R dissipates the following power:

$$P_2 = (\Delta V)^2 / R \ldots \quad (1)$$

When the inclination of a rise of the source voltage $V_{DD}$ is gentle, the potential of a point D is delayed behind that of a point C by ΔT in following the source voltage $V_{DD}$. This situation is shown in FIG. 2A. In each graph of FIGS. 2A and 2B, an ordinate indicates a voltage and an abscissa indicates time. A segment C of FIG. 2A represents the potential of the point C. The potential of the point C reaches the voltage $V_{CC}$ at time T. A segment D of FIG. 2A represents the potential of the point D. The potential of the point D follows the segment C with the delay of ΔT.

The transient response characteristics of the circuit of FIG. 1 with respect to a voltage having a ramp waveform as indicated with the segment C of FIG. 2A are obtained as follows according to boundary conditions of t=0 and i=0 where i is a current flowing to the circuit:

$$(r+R)i + \frac{1}{C_o} \int i \, dt = V_{DD}(t) = \frac{V_{CC}}{T} t \, (\text{for } 0 \leq t \leq T) \quad (2)$$

$$(r+R)i + \frac{1}{C_o} \int i \, dt = V_{CC} = \text{const} \, (\text{for } t > T) \quad (3)$$

The resistance r of the power source is less than 1/10000 of the internal resistance R of the transistor, and therefore, r=0 in the expressions (2) and (3).

The voltage ΔV(t)=Ri at the ends of the resistance R is expressed as follows:

$$\Delta V(t) = \frac{\tau}{T} V_{CC}(1 - e^{-\frac{t}{\tau}}) \quad \text{(for } 0 \leq t \leq T\text{)} \tag{4}$$

$$\Delta V(t) = \frac{\tau}{T} V_{CC} e^{-\frac{t-T}{\tau}} \quad \text{(for } t > T\text{)} \tag{5}$$

where $\tau = RC_o$ is a time constant determined by the load capacitance $C_o$ of a node of the circuit and the resistance R. FIG. 2B shows a change in the voltage $\Delta V(t)$. Energy $E_2$ dissipated by the resistance R is expressed as follows:

$$\begin{aligned}
E_2 &= \int_0^\infty \frac{\Delta V(t)^2}{R} dt \\
&= \frac{1}{R} \left(\frac{\tau}{T} V_{CC}\right)^2 \left\{ \int_0^T \left(1 - e^{-\frac{t}{\tau}}\right)^2 dt + \int_T^\infty e^{-\frac{t-T}{\tau}} dt \right\} \\
&\approx \frac{1}{2} C_o V_{CC}^2 \left(\frac{2\tau}{T}\right)
\end{aligned} \tag{6}$$

When the time constant $\tau = RC_o$ is sufficiently smaller than the rise time T of the source voltage $V_{DD}$, the time delay $\Delta T$ is expressed as follows:

$$\frac{\Delta T}{T} = \frac{\Delta V(T)}{V_{CC}} \approx \frac{\frac{\tau}{T} V_{CC}}{V_{CC}} = \frac{\tau}{T} \tag{7}$$

Namely, $\Delta T$ is nearly equal to $\tau$. By making $\tau$ sufficiently smaller than T, $\Delta T$ and $\Delta V(t)$ become smaller. As is apparent in the expression (6), the energy $E_2$ dissipated by the resistance R is small if the voltage $\Delta V(t)$ at the ends of the resistance R is small.

Since $\tau = \Delta T$, the expression (6) is written as follows:

$$E_2 \approx \frac{1}{2} C_o V_{CC}^2 \left(\frac{2\Delta T}{T}\right) \tag{8}$$

Applying the constant source voltage $V_{CC}$ at $t=0$ will be considered. When the switch SW is connected to a terminal T1, the load capacitor $C_o$ is charged by the power source $V_{CC}$ through the resistances r and R. Since the wiring resistance r is less than 1/10000 of the internal resistance R of the transistor, r=0. When the voltage $V_{CC}$ is applied at t=0, energy $E_1$ consumed by the resistor R is calculated like the expression (3) according to a voltage of "$\Delta V(t) = V_{CC} - V_a(t)$" at the ends of the resistor R. Here, $V_a(t)$ is a voltage at the point D, i.e., the output voltage of the transistor. The dissipated energy $E_1$ is expressed as follows:

$$E_1 = \int_0^\infty \frac{(V_{CC} - V_a(t))^2}{R} dt = \frac{1}{2} \times C_o (V_{CC})^2 \tag{9}$$

According to the expressions (8) and (9), the following is obtained:

$$E_2/E_1 = 2 \times (\Delta T/T) \ldots \tag{10}$$

The expression (10) is also true when the transistor is turned off. When the constant voltage $V_{CC}$ is applied at t=0, consumed energy per unit time, i.e., effective power is $P_1$, and when the inclined voltage $V_{DD}(t)$ is applied at t=0, effective power is $P_2$. If $\Delta V$ is 1/10 of $V_{DD}$, effective power dissipated by the MOS transistor (internal resistor R) is as follows:

$$P_2/P_1 = 2(\Delta T/T) \ldots \tag{11}$$

Namely, the effective power is reduced to 1/5 ($P_2/P_1 = 2 \times (1/10) = 1/5$).

The similar result can be obtained by using a sinusoidal wave source as long as the frequency of the sinusoidal wave is very low. If the alternating speed, or the period, of the sinusoidal wave voltage is slower than the operation speed of the internal elements of the MOS gate circuit, the effective power dissipation is also reduced.

A second aspect of the present invention drives a MOS gate circuit with a plurality of AC power sources having different phases, the alternating speed of the power sources is slower than the operating speed of each internal element of the MOS gate circuit. The power sources are connected to an LC resonance circuit having a resonance frequency substantially equal to the alternating speed of the power sources. A resonating inductance L of the resonance circuit absorbs and cancels charging and discharging currents from the power sources.

The second aspect of the present invention connects the resonance circuit to the power sources, so that the resonance circuit transiently absorbs and accumulates charge and discharge currents from an LSI, which incorporates the MOS gate circuits, and then returns them to the LSI. The second aspect eliminates a loss of charging and discharging energy in the power sources by alternately canceling charging and discharging currents, to thereby reduce power dissipation.

Energy absorbing efficiency is determined by the energy absorbing characteristics of the resonance circuit and the waveform (frequency component) of an alternating voltage applied to the resonance circuit. The AC power sources may be sinusoidal wave power sources or else.

It is preferable to employ the sinusoidal wave power sources because they are easy to fabricate and improve the effect of the resonance circuit. When the sinusoidal wave power sources are employed, the resonance circuit will be a simple LC resonance circuit. When the sinusoidal wave power sources are employed, the absorption efficiency of the resonance circuit will be more than 95%. If the power sources provide a ramp waveform or a trapezoidal waveform involving large harmonics (x2, x4, x8, . . . ), the absorption efficiency of the resonance circuit is deteriorated to 20% to 30%. Since the higher harmonics have large energy components, it is difficult to completely absorb them. When the power sources provide a correct sine wave, the energy loss of a single-pole LC resonance circuit synchronized with the period of the sine wave is only 1% to 2% due to the core loss of the inductance L and a heat loss due to wiring resistance. Namely, if 1% to 2% of the total charging and discharging energy is always supplemented from the outside, the LSI and the resonance circuit theoretically permanently exchange energy between them. In this way, the sinusoidal wave voltage provides a great effect of saving power.

A third aspect of the present invention employs the above-mentioned first or second aspect of the present invention as the voltage source to drive an internal circuit such as a MOS gate circuit. For example, a 2-phase AC power source can be used to drive a MOS gate circuit. The alternating speed of the 2-phase AC power source is slower than the operating speed of internal circuit elements of the MOS gate circuit. The internal circuit elements have at least two power supply terminals respectively. Each power supply terminal of the internal circuit element 611, 612 is connected to a cutoff means (Tr1, Tr2, Tr3, Tr4) that is connected to the power source 511, 512 as shown in FIG. 4A. The cutoff means is conductive only when one of the two phases of the power source is at high potential and the other at low potential. Compared with the conventional 4-phase clock circuit that requires strict constraints on the timing of clock signals, the third aspect of the present invention reduces the number of phases of the power source, to stabilize a circuit operation with a short latency without useless precharging operations and reduces power dissipation. The third aspect of the present invention employs the 2-phase clock to complete a logic operation in two clocks. Namely, the third aspect realizes a 2-clock logic memory element such as an F/F and a shift register. The third aspect greatly improves the degree of freedom of logic designing. The conventional 4-phase clock circuit is applicable only to a pocket calculator that carries out series logic operations and is inapplicable to parallel operation gates. The third aspect of the present invention involves only a delay of two clocks in a logic operation and is applicable to parallel operation gates.

According to the third aspect of the present invention, MOS gates may be cascaded to shorten a delay time, or a clock delay.

The third aspect of the present invention may employ the 2-phase AC power source whose alternating speed is slower than the operation speed of internal circuit elements, to drive a plurality of MOS gate circuits connected to one another to form a multi-staged gate circuit. Each of the MOS gate circuits is provided with cutoff units (cutoff means) that are conductive only when one of the phases of the power source is at high potential and the other at low potential. When one stage of the multi-staged MOS gate circuit is inactive, the next stage must be active and hold the charges transferred from the previous stage gate.

It is preferable to partly or wholly form the MOS gate circuits with an SOI structure, to eliminate latch-up and reduce source-drain capacitance.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
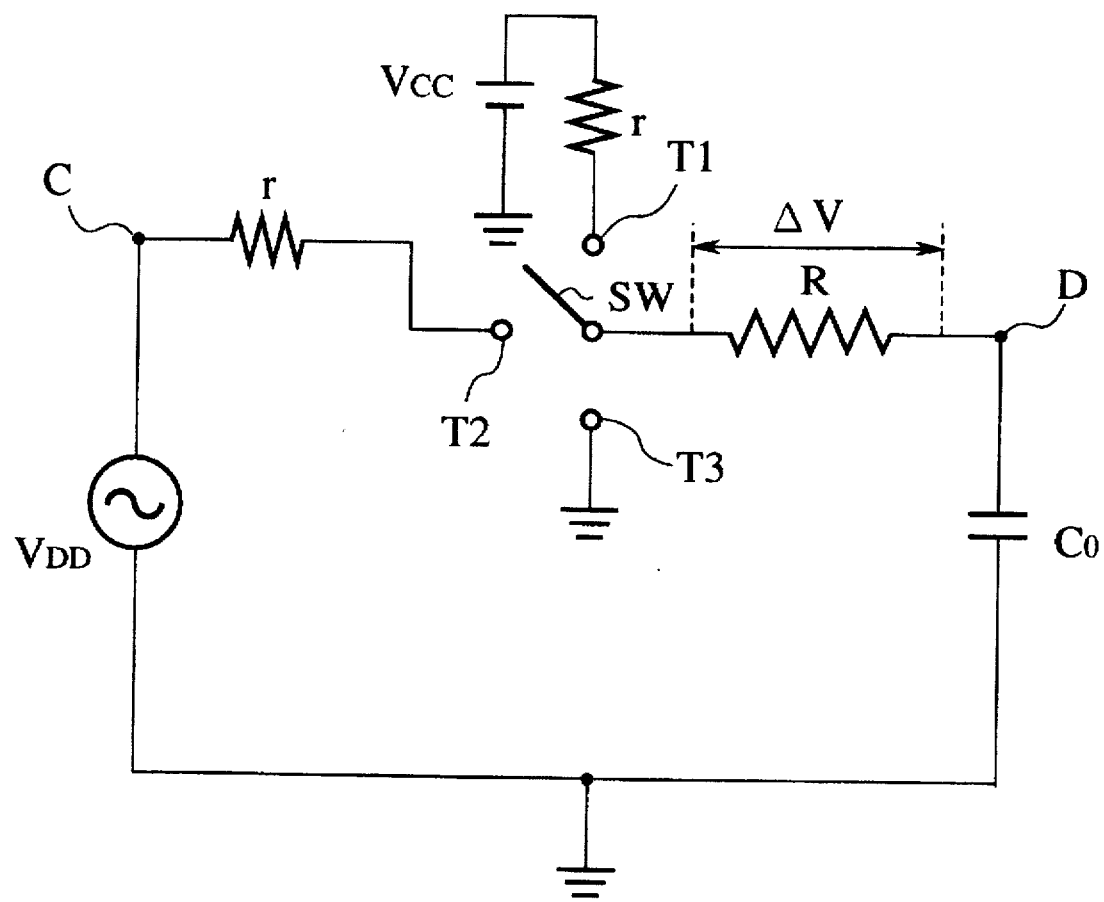
FIG. 1 is a circuit diagram showing the operation of a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First embodiment

The operation of a CMOS LSI according to the first embodiment of the present invention will be explained with reference to FIG. 1. The LSI consists of, for example, 1000 gates each employing CMOS elements having a gate length of about 0.5 µm. A source voltage to the LSI has a ramp waveform whose alternating speed is sufficiently slower than the speed of a logic operation of the LSI. Each logic gate of the LSI has six elements average. The gate delay $\Delta T$ of the CMOS elements having a gate length of 0.5 µm is about 0.3 ns per stage. If the frequency of a clock signal is 100 MHz, a period of the AC power source is 10 ns. In this case, the slope time T of the AC power source is, for example, about 3 ns.

Figure 2A:
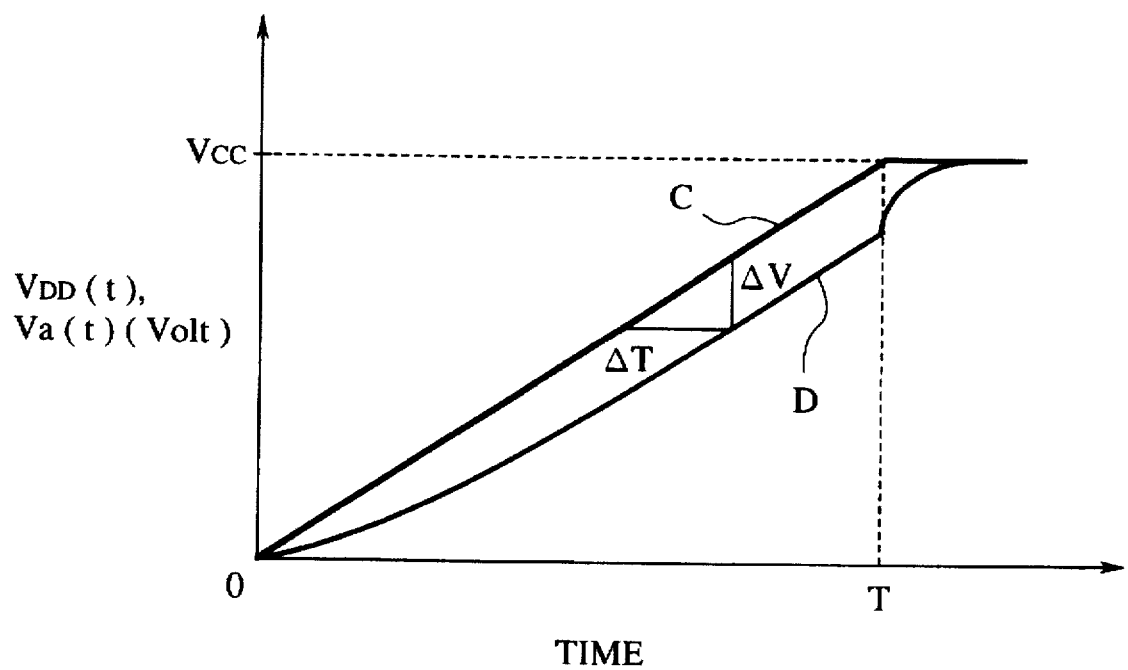
FIG. 2A is a graph showing a change in the potential of each point of the first embodiment in response to a source voltage having a ramp waveform.
Figure 2B:
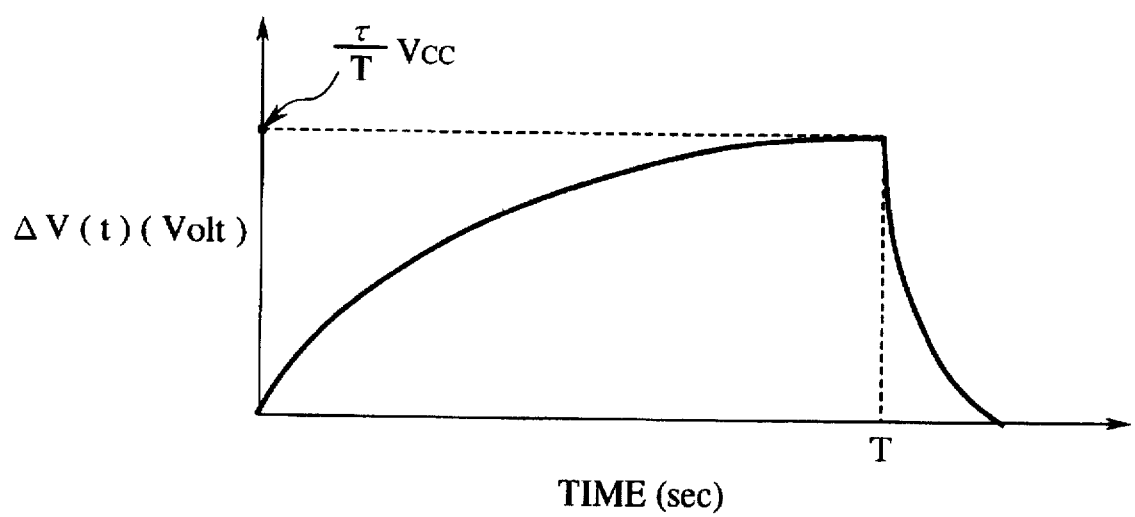
FIG. 2B is a graph showing a voltage change $\Delta V(t)$ at ends of a resistor R in response to the source voltage having a ramp waveform.

With $\Delta T=0.3$ ns and $T=3$ ns in FIG. 2A, the following is established:

$$\Delta T/T=0.3/3=\tfrac{1}{10}\ldots \qquad (12)$$

According to the expressions (8), (9), (10), and (11), the first embodiment that employs a power source voltage having a ramp waveform is capable of reducing power dissipation. Compared with the power dissipation $P_1$ of the conventional CMOS circuit that employs the constant power source VCC, the power dissipation $P_2$ of the first embodiment is $\tfrac{1}{5}$ as follows:

$$P_2/P_1=2\times(\Delta T/T)=\tfrac{1}{5}\ldots \qquad (13)$$

Second embodiment

Power dissipation of the second embodiment is not dependent on charging and discharging operations, unlike the effective power $P_2$ dissipated by the resistance R of the first embodiment. To charge a capacitor C from 0V to $V_{dd}$, electric energy of $\tfrac{1}{2}\times CV_{dd}^2$ is transferred from a power source to the capacitor C. If the frequency of the power source is 100 MHz, a pair of charging and discharging operations is repeated 100 million times per second. In this case, required power is as follows:

$$(E_c-E_D)(100,000,000/\text{sec}) \text{ Joule/sec} \ldots \qquad (14)$$

where $E_c$ is charging energy and $E_D$ is discharging energy. If the efficiency of an external resonance circuit is 100%, the charging energy is once stored in the resonance circuit, and 100% of the stored energy is reused in the next discharging cycle. Namely, an energy loss is zero, i.e., $(E_c-E_D)=0$, so that the charging and discharging operations of the capacitor C cause no energy loss. In practice, however, the efficiency of the resonance circuit is never 100% because of the following factors:

1. External circuits including the resonance circuit contain series resistances that cause energy loss to produce heat that is not recovered.

2. If a sine wave from the AC power source is distorted, various higher harmonics occur. To avoid this, poles must resonate. This results in complicating the resonance circuit. In addition, Q becomes smaller to drastically decrease absorption efficiency.

Figure 3:
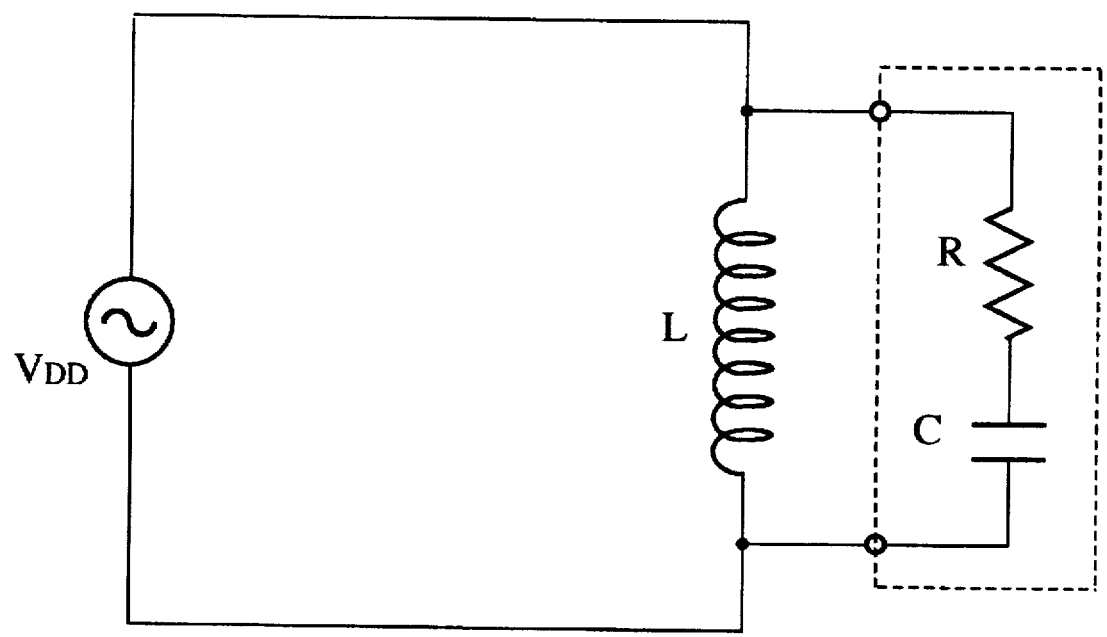
FIG. 3 is a circuit diagram showing the operation of a second embodiment of the present invention.

These factors will be explained with reference to FIG. 3 that shows a resonance circuit composed of L, R, and C. The resistor R is equivalent to the internal resistance of transistors in a chip. The capacitor C is equivalent to gate capacitance and wiring capacitance. The resistor R and capacitor C are connected in series to form an RC circuit. The RC circuit and the external inductance L are connected in parallel with each other. The resonance circuit resonates (current resonance) at a frequency of ωo=1/√LC, to provide a maximum impedance. At this time, a current from the AC power source $V_{DD}$ to the chip and resonance circuit is a minimum to substantially supplement a loss caused by the resistor R.

The resistor R and capacitor C have a time constant of τ=RC, and the resonance frequency ωo is determined by √LC. If the ratio of τ to √LC is 1:9, the ratio of the potential difference of an alternating voltage applied to the resistor R to the potential difference of an alternating voltage applied to the capacitor C is 1:9. Since the alternating voltage applied to the ends of the resistor R is only 1/10 of the total voltage VDD, the power dissipation of the resistor R is 1/10 of the power dissipation of the prior art.

The power source of the second embodiment is a sine wave oscillator having a parallel resonance circuit. The sine wave output of the power source involves only negligible higher harmonics. Nonlinear capacitance in the LSI and a load fluctuation due to a change in the resistor R due to a logic operation may cause higher harmonic components. Accordingly, the efficiency of the resonance circuit of the second embodiment is over 95%.

The efficiency of an LC resonance circuit driven with a rectangular wave is less than 15%, and when it is driven with a trapezoidal wave, about 40%, to require more charging energy to be supplied from an external power source. The prior art that employs an irreversible DC power source such as a battery is incapable of storing charging/discharging energy. Namely, the energy is abandoned, and required energy must be supplied from an external power source. In this case, the efficiency is 0%.

An LSI containing one million gates incorporates six million transistors. When the gate capacitance of one transistor is 20 fF, the total capacitance of all gates is 120 nF. If the LSI employs a power source voltage $V_{CC}$ of 3.0V and if each gate has an equivalent charging resistance of about 50 kiloohms, the total resistance of the one million gates is 0.05 ohms. In this case, the total charging/discharging power of the prior art employing the DC power source is as follows when the power source is of 100 MHz:

$$(1/2)2CV^2 \times f = 1/2 \times 120 \times 10^{-9} \times (3.0)^2 \times 10^8 \quad (15)$$
$$= 54 W$$

When the LSI containing one million gates is driven at 100 MHz by the conventional power source, the charging/discharging power of 54W is dissipated.

The second embodiment requires no precharge operation at each clock and needs a charging/discharging operation only for a logic transition. An average of the probabilities of transition of the logic gates is about 1/5, and therefore, the second embodiment reduces the total charging/discharging energy to 10.8W. The external LC resonance circuit of 100 MHz of the second embodiment stores and recovers about 95% of charging/discharging reactance currents of the internal capacitor C. Consequently, the second embodiment reduces the charging/discharging power of 54W of the prior art to 10.8W×0.05=0.54W.

During charging and discharging processes in the LSI, the equivalent resistance R dissipates an energy of 54W, which is equal to the expression (15). Since the probability of transition of each gate is 1/5, the energy lost by the resistance R is 10.8W similar to the charging/discharging energy. The source voltage having a ramp waveform of the first embodiment may reduce this energy dissipation to 1/5 as shown in the expression (13). Namely, the heat energy produced by the resistance R is reduced to 2.16W. Although the ramp source voltage of FIG. 2A is linear, the same effect as this source voltage is obtained by a sine wave whose period is sufficiently longer than a gate delay time.

Table 1 shows total power dissipated by the embodiment and prior art.

TABLE 1

|  | Prior art | 4-phase dynamic circuit | Present invention |
|---|---|---|---|
| Power to charge C | 10.4 W | 54/4 = 13.5 W | 0.54 W |
| Power P dissipated as heat | 10.4 W | 13.5 W | 2.16 W |
| Total power per chip | 20.8 W | 27 W | 2.70 W |
| Actual speed | 100 MHz | 25 MHz | 100 MHz |
| Clock delay | 1 clock | 4 clocks | 1 clock |

Third embodiment

The third embodiment provides a CMOS dynamic circuit that employs the techniques of the first and second embodiments, to correctly carry out logic operations with a small number of clocks and a short latency (clock delay).

Figure 4A:
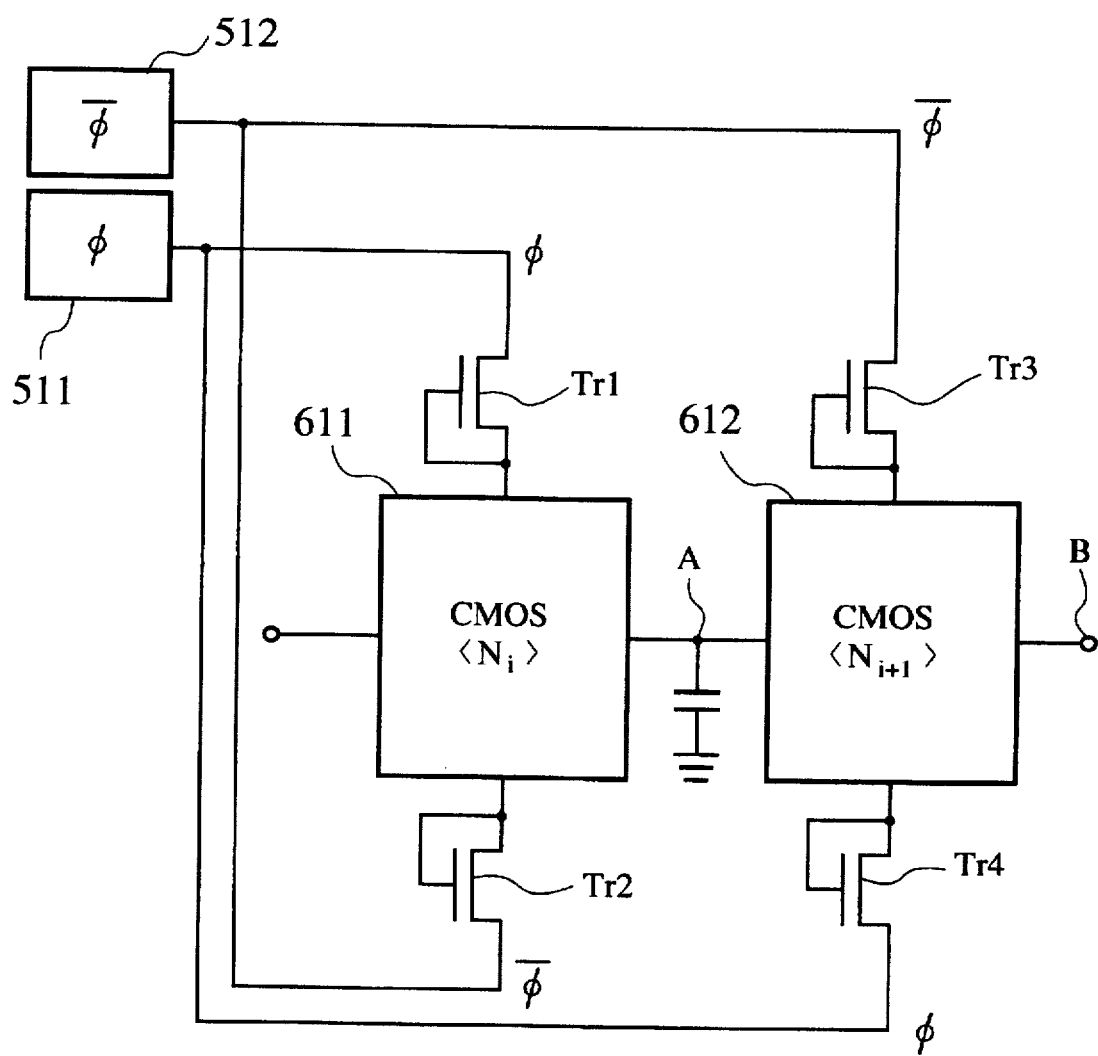
FIGS. 4A and 4B show CMOS gate circuits according to a third embodiment of the present invention.

FIG. 4A shows MOS gate circuits according to the embodiment. A plurality of stages of the CMOS gate circuits as internal circuit elements are connected in series. Each internal circuit element has two power supply terminals. For example, a first internal circuit element 611 has first and second power supply terminals. And, a second internal circuit element 612 has third and fourth power supply terminals. The figure shows a stage $N_i$ and a stage $N_{i+1}$. The first and second power supply terminals of the CMOS gate circuit 611 (as the first internal circuit element) of the stage $N_i$ are connected to MOS transistors Tr1 and Tr2 (as first and second cutoff means respectively) that are connected to a 2-phase AC power source 511, 512. The third and fourth power supply terminals of the CMOS gate circuit 612 (as the second internal circuit element) of the stage $N_{i+1}$ are connected to transistors Tr3 and Tr4 (as third and fourth cutoff means respectively) that are connected to the 2-phase AC power source 511, 512. In each of the transistors Tr1 to Tr4, a gate electrode is connected to a source electrode.

Figure 5:
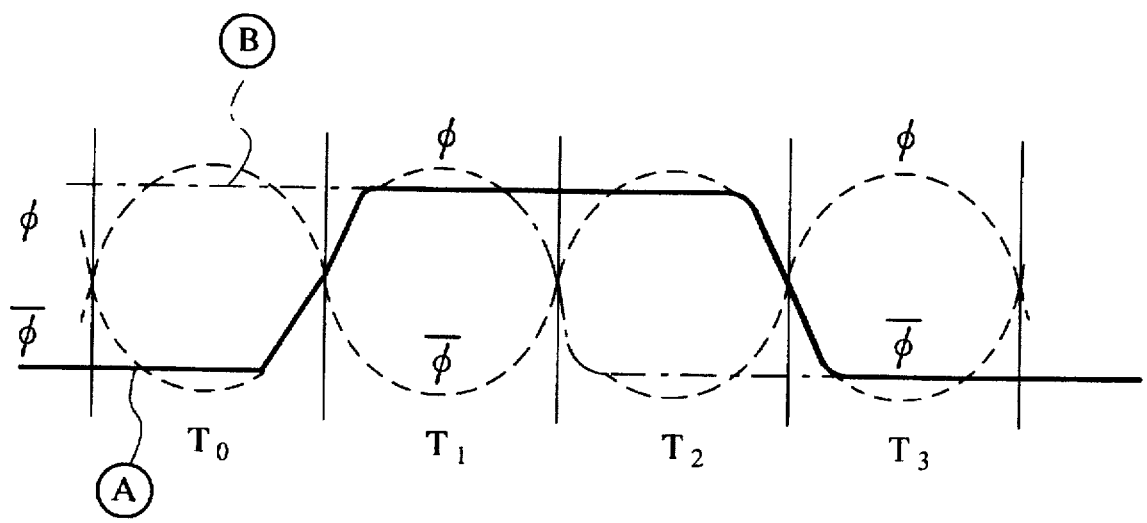
FIG. 5 shows a waveform of the output of the CMOS gate circuit of FIG. 4A.

Dotted lines of FIG. 5 show the waveforms of the 2-phase (opposite phase) AC power source for driving the CMOS gate circuits 611, 612. In FIG. 5, "A" indicates the potential of a point A of FIG. 4A, and "B" indicates the potential of a point. B. The gate $N_i$ is turned on in periods $T_1$ and $T_3$ and is turned off in periods $T_0$ and $T_2$ by the transistors Tr1 and Tr2. During the off periods, the gate $N_i$ stores the state of a preceding clock. Namely, the output (the point A) of the gate $N_i$ that is active in the period $T_1$ is held during the period $T_2$, and therefore, the gate $N_{i+1}$ operates during the period $T_2$ by using the output of the gate $N_i$.

The MOS transistors Tr1 and Tr2 of the gate $N_i$ are conductive only in the periods $T_1$ and $T_2$ where the power source voltage to the transistor Tr1 is at high potential φ and the power source voltage to the transistor Tr2 is at low potential $\bar{\phi}$, to thereby activate the gate $N_i$. The gate $N_i$ is off in the periods $T_0$ and $T_2$, to prevent accumulated charge at the point A from being abandoned.

Figure 4B:
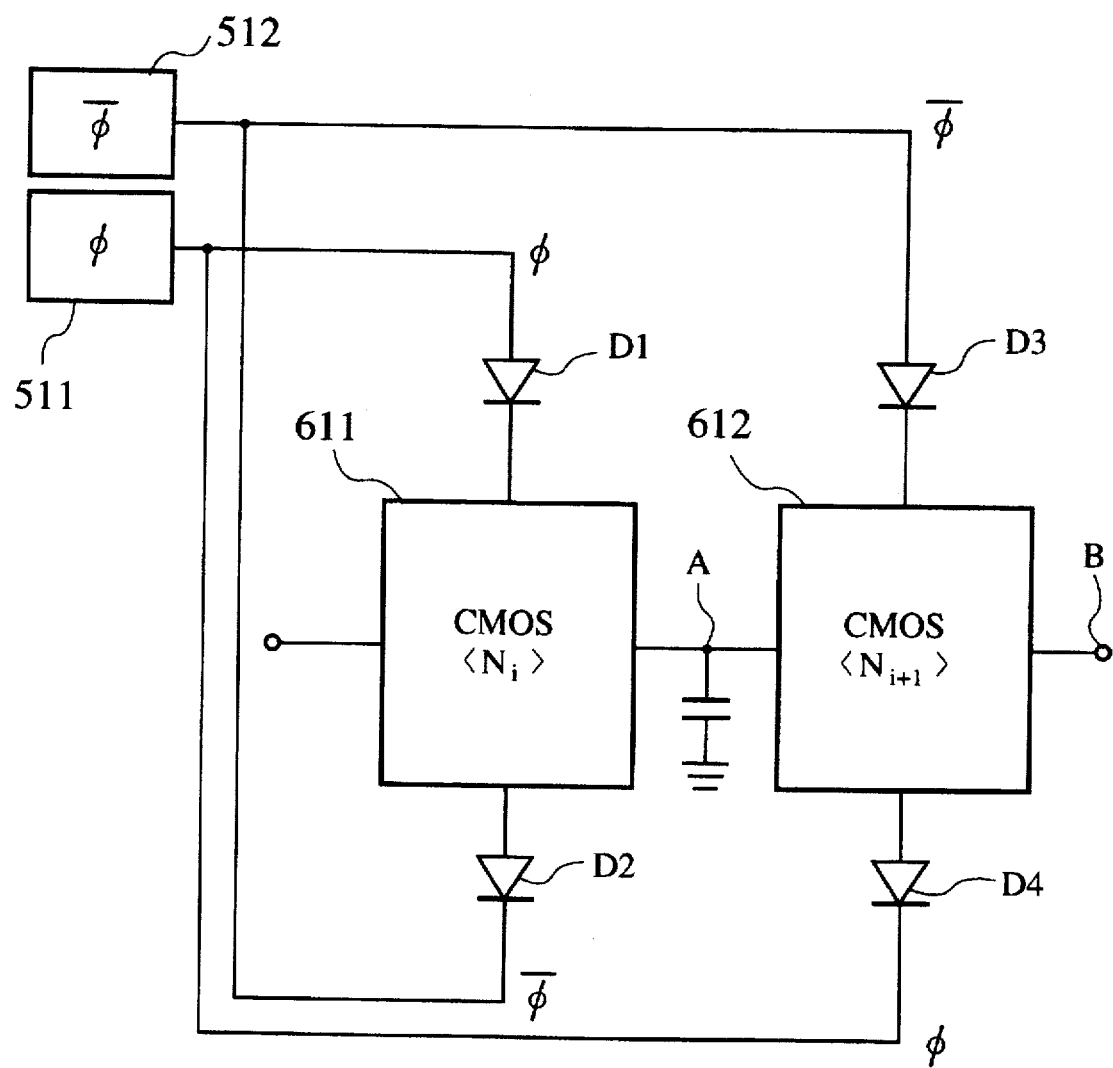

The third embodiment supplies the 2-phase AC power to each gate through transistors. This arrangement does not limit the present invention. For example, the MOS transistors Tr1 to Tr4 may be diodes D1 to D4 as shown in FIG. 4B. The diodes are synchronized with the AC power source 511, 512, and the arrangement of FIG. 4B operates in the same way as that of FIG. 4A so that points A and B of FIG. 4B may provide the waveforms of FIG. 5.

The third embodiment eliminates unnecessary precharge operations, to greatly reduce power dissipation. The third embodiment completes a logic operation in two clocks, to realize a logic memory element such as an F/F and a shift register of two clocks. This results in expanding the degree of freedom of logic designing. The conventional 4-phase clock circuit is applicable only to a series logic used for, for example, a pocket calculator and is inapplicable to parallel operation gates. The third embodiment not only improves the degree of freedom of logic designing but also reduces a delay in a logic operation to two clocks.

In the non-precharge dynamic CMOS circuit of the third embodiment, several gates may be cascaded to one another in one clock. Namely, each CMOS gate circuit 611, 612 of FIGS. 4A or 4B may have several internal gates that are cascaded to one another. According to the prior art, a precharge operation must be carried out for every gate at every clock. The third embodiment cascades several internal gates in each CMOS gate circuit and operates them in one clock. When N stages of gates are collectively operated in one clock, a delay time or a clock delay is shortened to 1/N. This arrangement eliminates N precharge operations, to greatly improve the ratio of speed to power.

It is preferable that the CMOS gate circuit of the third embodiment partly or wholly has an SOI (Silicon-On-Insulator) structure to eliminate latch-up and reduce source-drain capacitance.

Fourth embodiment

Figure 6:
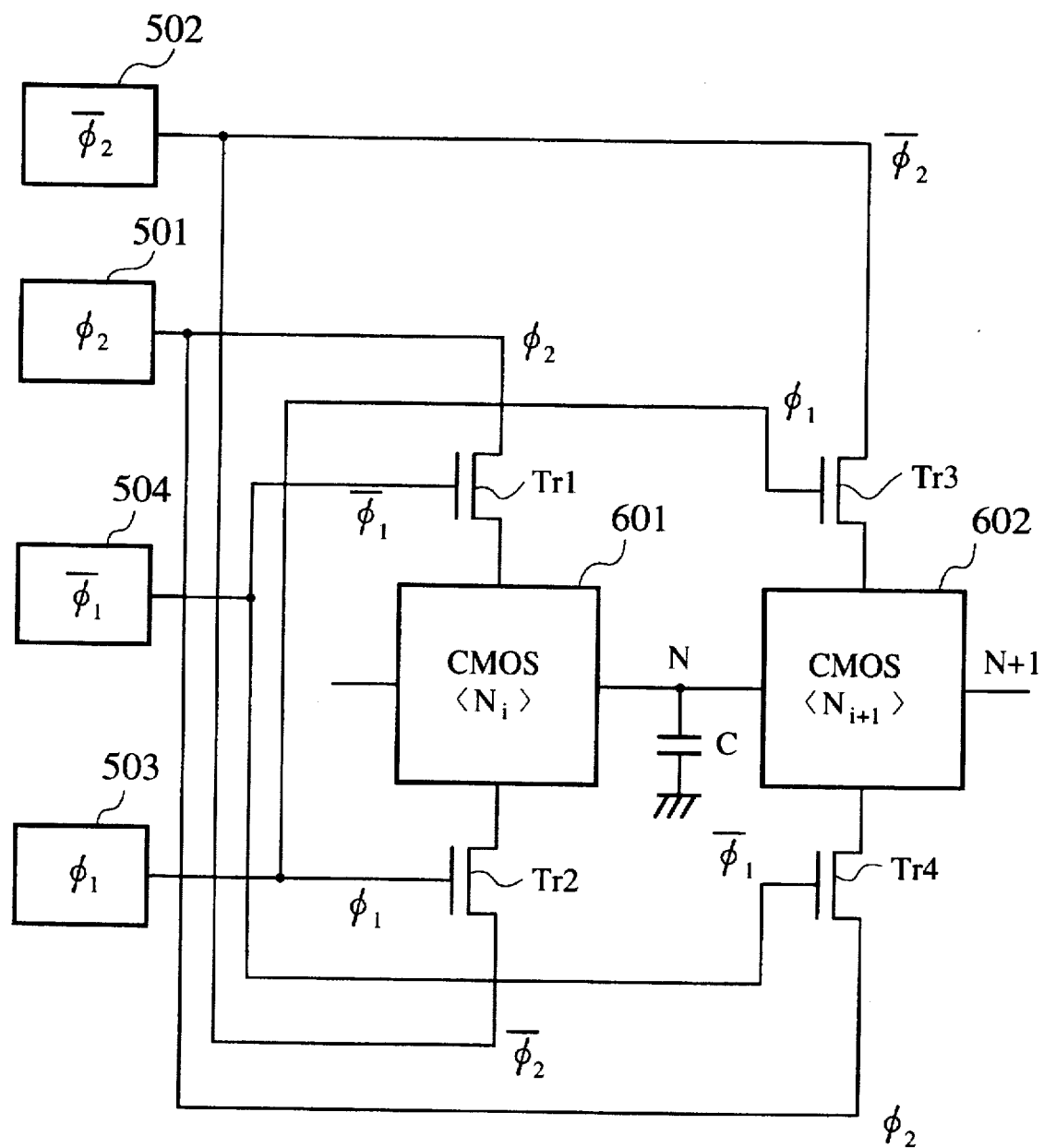
FIG. 6 shows a CMOS gate circuit according to a fourth embodiment of the present invention.
Figure 7:
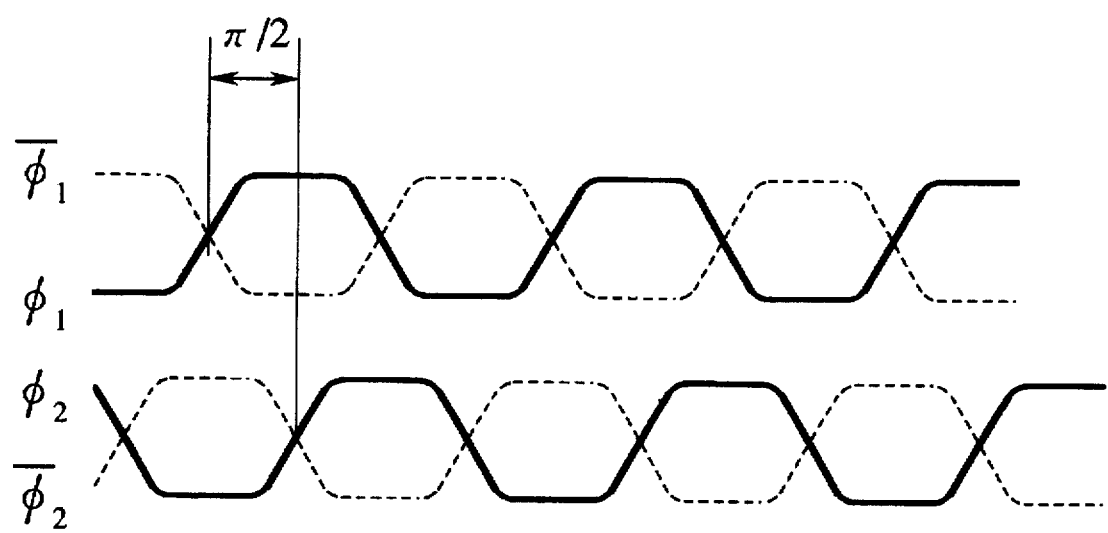
FIG. 7 shows a relationship among the phases of a 4-phase AC power source for driving the CMOS gate circuit of FIG. 6.

FIG. 6 is a circuit diagram showing CMOS gate circuits according to the fourth embodiment of the present invention. This embodiment employs a 4-phase AC power source 501, 502, 503, 504 as a power source. FIG. 7 shows the phases of output waveforms of the power source. Among a plurality of stages of the CMOS gate circuits connected in series, FIG. 6 shows stages $N_i$ and $N_{i+1}$. Each CMOS gate circuit receives a source voltage through MOS transistors connected to the power source.

A MOS transistor Tr1 connected to a CMOS gate 601 of the stage $N_i$ has a drain electrode connected to a phase $\phi_2$ of the power source 501 and a gate electrode connected to a phase $\bar{\phi}_1$ of the same 504. A MOS transistor Tr2 connected to the CMOS gate 601 has a drain electrode connected to a phase $\bar{\phi}_2$ of the power source 502 and a gate electrode connected to a phase $\phi_1$ of the same 503.

A MOS transistor Tr3 connected to a CMOS gate 602 of the stage $N_{i+1}$ has a drain electrode connected to the phase $\bar{\phi}_2$ and a gate electrode connected to the phase $\phi_1$. A MOS transistor Tr4 connected to the CMOS gate 602 has a drain electrode connected to the phase $\phi_2$ and a gate electrode connected to the phase $\bar{\phi}_1$. The phases $\phi_1$ and $\phi_2$ are shifted from each other by $\pi/2$ as shown in FIG. 7. The CMOS gate 601 is conductive when the phases $\phi_2$ and $\bar{\phi}_1$ are at high potential and the phases $\bar{\phi}_2$ and $\phi_1$ are at low potential. At this time, the CMOS gate 602 is off, to prevent charge at a capacitor C between the stages $N_i$ and $N_{i+1}$ from being abandoned. When the stage $N_{i+1}$ is conductive, the CMOS gate 601 of the stage $N_i$ is off, to hold the state of the preceding clock. Compared with a 2-phase clock, the 4-phase clock is disadvantageous in the degree of freedom of logic designing and a clock delay. In spite of the disadvantages, the CMOS gate circuit driven by the 4-phase clock power source can eliminate precharge operations to greatly reduce power dissipation.

It is preferable that the CMOS gate circuit of the fourth embodiment has partly or wholly an SOI structure to eliminate latch-up and reduce source-drain capacitance. The SOI structure further reduces the power dissipation.

Fifth embodiment

The fifth embodiment provides a CMOS dynamic circuit that employs the techniques of the first and second embodiments, to correctly carry out logic operations with a small number of clocks and a short latency (clock delay).

Figure 8:
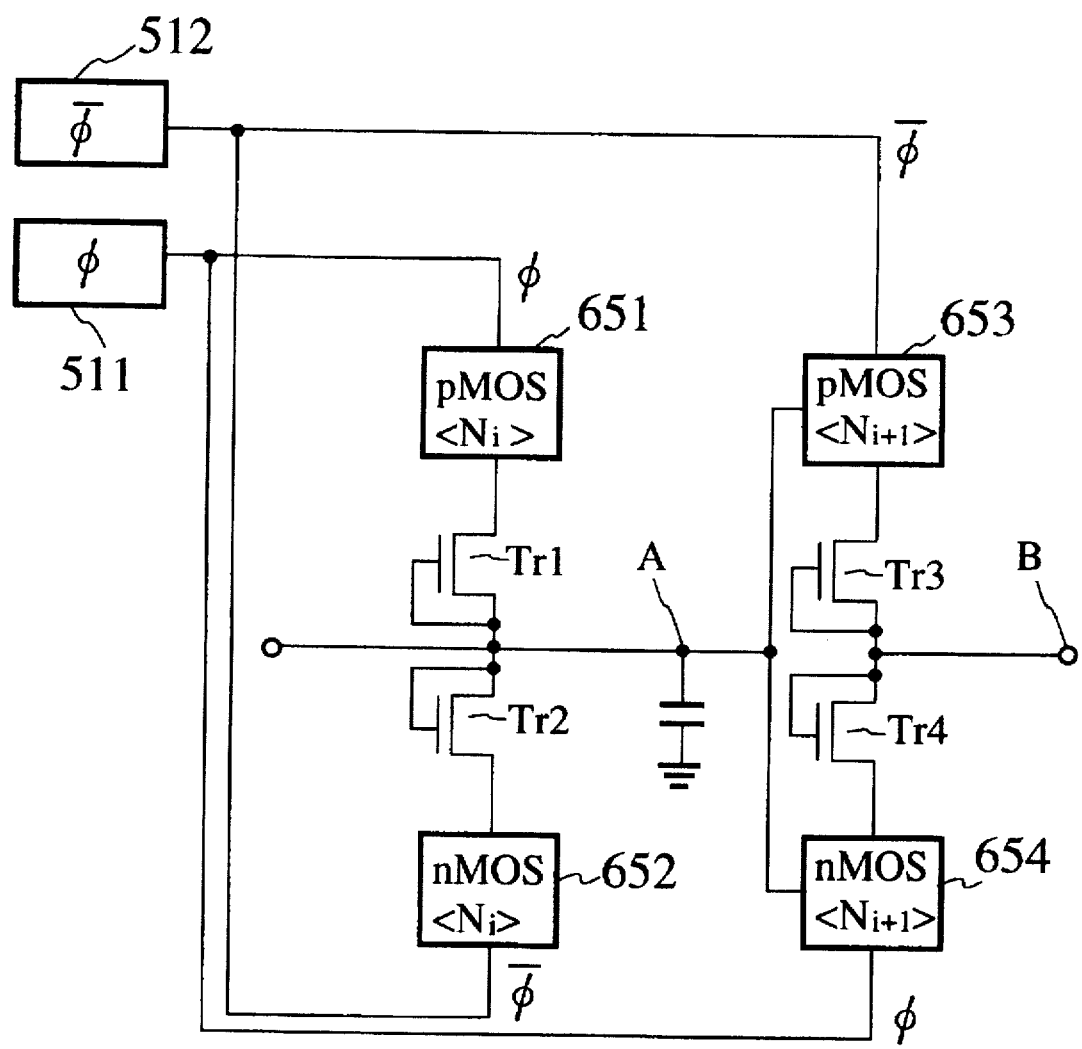
FIG. 8 shows a CMOS gate circuit according to a fifth embodiment of the present invention.

FIG. 8 shows MOS gate circuits according to the embodiment. A plurality of stages of the CMOS gate circuits comprising pMOS and nMOS circuits are connected in series. Each pMOS circuit and nMOS circuit has two power supply terminals. For example, a first pMOS circuit 651 has first and second power supply terminals. And, a first nMOS circuit 652 has third and fourth power supply terminals. A second pMOS circuit 653 has fifth and sixth power supply terminals, and a second nMOS circuit 654 has seventh and eighth power supply terminals. The figure shows a stage $N_i$ and a stage $N_{i+1}$. The second power supply terminals of first pMOS circuit 651 of the stage $N_i$ is connected to MOS transistor Tr1, and the first power supply terminals of the first pMOS circuit 651 is connected to AC power source 511. The third terminal of the first nMOS circuit 652 is connected to MOS transistor Tr2, and the fourth power supply terminal of the first nMOS circuit 652 is connected to AC power source 512. The sixth terminal of the second nMOS circuit 653 is connected to MOS transistor Tr3, and fifth terminal is connected to AC power source 512. The seventh terminal of the second nMOS circuit 654 is connected to MOS transistor Tr4, and eighth terminal is connected to AC power source 511.

The operation of the CMOS dynamic circuit is essentially same as that of third embodiment. The AC power source 511, 512 have opposite phase as shown in FIG. 5. The gate $N_i$ is turned on in periods $T_1$ and $T_3$ and is turned off in periods $T_0$ and $T_2$ by the transistors Tr1 and Tr2 as shown in FIG. 5. During the off periods, the gate $N_i$ stores the state of a preceding clock. Namely, the output (the point A) of the gate $N_i$ that is active in the period $T_1$ is held during the period $T_2$, and therefore, the gate $N_{i+1}$ operates during the period $T_2$ by using the output of the gate $N_1$. The MOS transistors Tr1 and Tr2 of the gate $N_i$ are conductive only in the periods $T_1$ and $T_2$ where the power source voltage to the transistor Tr1 is at high potential $\phi$ and the power source voltage to the transistor Tr2 is at low potential $\bar{\phi}$, to thereby activate the gate $N_i$. The gate $N_i$ is off in the periods $T_0$ and $T_2$, to prevent accumulated charge at the point A from being abandoned.

Various modifications will become possible for those skilled in the art receiving the teachings of the present disclosure without departing from the scope thereof. For example, a first DC power source may be connected in series to AC power source 511 and a second DC power source may be connected in series to AC power source 512, thereby supplying the AC power with predetermined DC voltage levels to the CMOS gate circuits.

What is claimed is:

1. A MOS gate circuit comprising:
  a) a first internal circuit having first internal circuit elements each made of a MOS transistor, and a first and a second power supply terminals for connecting a source voltage to the first internal circuit elements;
  b) a first cutoff means having a first end connected to the first power supply terminal;
  c) a second cutoff means having a first end connected to the second power supply terminal;
  d) a first AC power source having a first phase and connected to a second end of the first cutoff means; and
  e) a second AC power source having a second phase and connected to a second end of the second cutoff means, the alternating speed of the first and second AC power sources being slower than the operation speed of the first internal circuit elements, the first and second phases being opposite to each other, and the first internal circuit elements being conductive only when the first phase is at high potential.

2. A circuit as claimed in claim 1, further comprising:

f) a second internal circuit having a second internal circuit elements electrically coupled with the first internal circuit elements, and a third and a fourth power supply terminals for connecting a source voltage to the second internal circuit elements;

g) a third cutoff means having a first end connected to the third power supply terminal; and h) a fourth cutoff means having a first end connected to the fourth power supply terminal, a second end of the third cutoff means being connected to the second AC power source, and a second end of the fourth cutoff means being connected to the first AC power source.

3. A circuit as claimed in claim 2, wherein the second internal circuit elements are not conductive when the first internal circuit elements are conductive.

4. A circuit as claimed in claim 1, wherein each of the first and second cutoff means is a MOS transistor, the gate electrode of the MOS transistor being connected to one of the source and drain electrodes thereof.

5. A circuit as claimed in claim 1, wherein each of the first and second cutoff means is a diode.

6. A circuit as claimed in claim 1, wherein the first internal circuit and first and second cutoff means are partly or wholly made of SOI elements.

7. A circuit as claimed in claim 1, wherein the first internal circuit elements are MOS gate circuits that are cascaded to one another and are each electrically coupled with the first and second cutoff means.

8. A circuit as claimed in claim 7, wherein the MOS gate circuits are collectively operated in response to a single clock.

9. A circuit as claimed in claim 1, further comprising a first DC power source connected in series to said first AC power source, and a second DC power source connected in series to said second AC power source.

10. A MOS gate circuit comprising:

a) an internal circuit composed of a MOS transistor expressed with an equivalent resistor R and an equivalent capacitor C connected in series;

b) an inductance L connected in parallel with the internal circuit at connecting points; and c) an external AC power source for supplying a predetermined voltage between one of said connecting points of the inductance L and the internal circuit and another connecting point thereof, wherein the frequency $f_o$ of the external AC power source is expressed as follows:

$$f_o = \frac{1}{2\pi\sqrt{LC}}$$

wherein charging and discharging currents from the external AC power source to the internal circuit are absorbed and canceled by the inductance L.

11. A circuit as claimed in claim 10, wherein a value of $\sqrt{LC}$ is greater than a time constant of $\tau=RC$.

12. A power supplying method of a MOS gate circuit, comprising the steps of:

forming an LCR resonance circuit by adding an inductance L in parallel with an internal circuit made of a MOS transistor, the internal circuit being expressed as an RC series circuit composed of an equivalent resistor R and an equivalent capacitor C connected in series; and driving the internal circuit by applying a voltage between one of the connecting points of the internal circuit and the inductance L and another connecting point thereof, said voltage being supplied by an AC power source having a resonance frequency of the LCR resonance circuit, so that charging and discharging currents from the AC power source to the internal circuit are absorbed by the inductance L.

13. A power supplying method of a MOS gate circuit comprising an internal circuit having internal circuit elements, the internal circuit operating between high and low level supply voltages, comprising the step of supplying the internal circuit with an alternating source voltage defined as a difference between the high and low level supply voltages, the period of the alternating source voltage being longer than the gate delay time of the internal circuit elements, wherein phases of the high and low level supply voltages are opposite to each other.

14. A method as claimed in claim 13, wherein the alternating source voltage is made of a sinusoidal waveform.

15. A method as claimed in claim 13, wherein the alternating source voltage is substantially made of a rectangular waveform whose rise time and fall time are each longer than the gate delay time.

16. A method as claimed in claim 15, wherein the alternating source voltage has a ramp waveform portion that rises at a predetermined inclination.

17. A method as claimed in claim 15, wherein the rise time is 5 to 20 times longer than the gate delay time.

18. A method as claimed in claim 13, wherein the alternating source voltage is composed of a couple of alternating voltages whose phases are shifted from each other by $\pi$.

19. A method as claimed in claim 13, wherein the MOS gate circuit comprises a sequence of the internal circuits cascaded to one another, and wherein said supplying step comprises the step of supplying a couple of alternating voltages whose phases are shifted from each other by $\pi$ to the internal circuits so that, when one of the internal circuits is active, the next internal circuit is inactive.

20. A MOS gate circuit comprising:

a) a first pMOS circuit having a first and a second power supply terminals;

b) a first nMOS circuit having a third and a fourth power supply terminals;

c) a first cutoff means having a first and a second end, the first end connected to the second power supply terminals;

d) a second cutoff means having a third and a fourth end, the third and connected to the third power supply terminals; and the fourth end connected to the second end of the first cutoff means;

e) a first AC power source having a first phase and connected to the first power supply terminals; and f) a second AC power source having a second phase and connected to the fourth power supply terminals, wherein the alternating speed of the first and second AC power sources being slower than the operation speed of the first pMOS and CMOS circuits, the first and second phases being opposite to each other, and the first pMOS circuit being conductive only when the first phase being at high potential.

21. A circuit as claimed in claim 20, further comprising:

g) a second pMOS circuit having a fifth and a sixth power supply terminals;

h) a second nMOS circuit having a seventh and an eighth power supply terminals;

i) a third cutoff means having a fifth and a sixth end, the fifth end connected to the sixth power supply terminals; and j) a fourth cutoff means having a seventh and an eighth end, the seventh end connected to the seventh power supply terminals, and the eighth end connected to the sixth end;

wherein the fifth power supply terminals connected to said second AC power source, and the eighth power supply terminals connected to said first AC power source.

22. A circuit as claimed in claim 20, wherein the second pMOS circuit is not conductive then the first pMOS circuit is conductive.

* * * * *